United States Patent
Domke et al.

(10) Patent No.: US 7,378,666 B2
(45) Date of Patent: May 27, 2008

(54) IRRADIATION DEVICE FOR TESTING OBJECTS COATED WITH LIGHT-SENSITIVE PAINT

(75) Inventors: Wolf-Dieter Domke, Adelsdorf (DE); Larissa Juschkin, Herzogenrath (DE); Karl Kragler, Erlangen (DE); Rainer Lebert, Kelmis (BE); Manfred Meisen, Aachen (DE)

(73) Assignees: Qimonda AG, Munich (DE); AIXUV GmbH, Aachen (DE)

( * ) Notice: Subject to any disclaimer, the term of this patent is extended or adjusted under 35 U.S.C. 154(b) by 351 days.

(21) Appl. No.: 10/530,964

(22) PCT Filed: Oct. 8, 2003

(86) PCT No.: PCT/DE03/03381

§ 371 (c)(1),
(2), (4) Date: Oct. 31, 2005

(87) PCT Pub. No.: WO2004/036312

PCT Pub. Date: Apr. 29, 2004

(65) Prior Publication Data

US 2006/0138311 A1    Jun. 29, 2006

(30) Foreign Application Priority Data

Oct. 11, 2002  (DE)  ................................ 102 47 626
Feb. 10, 2003  (DE)  ................................ 103 05 573

(51) Int. Cl.
    *G01J 1/42*    (2006.01)
(52) U.S. Cl. ...................................................... 250/372
(58) Field of Classification Search .................. 250/372
    See application file for complete search history.

(56) References Cited

U.S. PATENT DOCUMENTS

| 4,474,864 | A | 10/1984 | Chow et al. |
| 6,611,574 | B2 | 8/2003 | Singer et al. |
| 6,658,084 | B2 * | 12/2003 | Singer .......................... 378/34 |
| 2003/0058429 | A1 | 3/2003 | Schriever |
| 2003/0146391 | A1 | 8/2003 | Kleinschmidt et al. |
| 2003/0170552 | A1 | 9/2003 | Miyashita et al. |
| 2004/0061930 | A1 | 4/2004 | Wedowski |

(Continued)

FOREIGN PATENT DOCUMENTS

DE    100 53 587 A1    5/2002

(Continued)

*Primary Examiner*—Christine Sung
(74) *Attorney, Agent, or Firm*—Slater & Matsil, L.L.P.

(57) ABSTRACT

The invention concerns an irradiation device for testing objects coated with light-sensitive paint, comprising a EUV radiation source, an optical system for filtering the radiation of the EUV radiation source a chamber for receiving the object, as well as systems for intersecting the trajectory of the rays on the object. The invention also concerns a method for operating such a device. The invention aims at obtaining as quickly as possible an illumination at least partly simultaneous of several irradiation fields, with different doses, by using an inexpensive laboratory radiation source without resorting to complex optical systems. Therefor, the invention provides a device comprising a simplified and compact optical system, with closable diaphragm apertures located in front of the object to be irradiated and at least one control sensor placed on the trajectory of the rays and enabling the radiation dose to be measured.

20 Claims, 5 Drawing Sheets

U.S. PATENT DOCUMENTS

2005/0274897 A1* 12/2005 Singer et al. ............... 250/372
2006/0192935 A1*  8/2006 Hansen et al. ................ 355/69

FOREIGN PATENT DOCUMENTS

| DE | 101 36 620 A1 | 2/2003 |
| DE | 102 04 994 A1 | 8/2003 |
| WO | WO 02/29870 A1 | 4/2002 |
| WO | WO 02/059905 A2 | 8/2002 |

* cited by examiner

IRRADIATION DEVICE FOR TESTING OBJECTS COATED WITH LIGHT-SENSITIVE PAINT

TECHNICAL FIELD

The invention relates to a device for the test irradiation of objects coated with photosensitive resists having an EUV radiation source, an optical system for filtering the radiation from the EUV radiation source, a chamber for receiving the object and also means for interrupting the beam path onto the object. The invention additionally relates to a method for operating such a device.

BACKGROUND

The term lithography denotes, in semiconductor technology, a method for transferring circuit patterns of microelectronic components and integrated circuits onto a silicon semiconductor slice, the wafer. For this purpose, firstly a mask is produced which contains the pattern in the form of differences in transparency for the beams which are used to transfer said pattern onto the wafer. The wafer surface is coated with a radiation-sensitive photoresist and exposed through the mask. Semiconductor structures are transferred onto the photoresist, by means of a so-called lithography scanner. During the subsequent development, depending on whether a positive or negative resist is involved, the exposed or unexposed photoresist is dissolved away and the wafer surface is uncovered at these locations.

On account of the decreasing feature size of semiconductors, the fabrication of modern semiconductor elements, such as, for example, memory chips and CPUs, requires a resolution which makes it necessary to use extremely short-wave radiation of approximately 13 nm with a quantum energy of approximately 92 eV (EUV radiation). The irradiation wavelengths of 248 nm (UV radiation), 193 nm (DUV radiation) or 157 nm (VUV radiation) used heretofore no longer suffice to produce the shrinking structures. As the feature size and wavelength decrease, however, there is an increase in the requirements made of the resists used, the so-called resist material, as far as both the sensitivity and the line roughness are concerned.

The changed requirements made of resists require the test systems thereof to be adapted, said test systems being used to determine the resist properties with varying irradiation before series production of the wafers.

EUV radiation is absorbed by matter to an extremely high degree. It is necessary, therefore, for the EUV radiation to be guided under ultra-high vacuum conditions. The source of the EUV radiation is a thermally emitting plasma. In contrast to the lasers used heretofore, plasma emits in a very broad band, so that DUV, VUV and UV radiation are also obtained besides the desired EUV radiation. It is necessary, therefore, to keep this radiation away from the resists by means of spectral filters.

So-called EUV beam tubes on synchrotron storage rings which emit monochromatized EUV radiation constitute a highly stable EUV radiation source for researching EUV lithography technology. Such EUV radiation sources emit very short radiation pulses (<1 ns) with repetition frequencies of a few MHz, so that these EUV sources are often referred to as quasi-cw sources. On EUV beam tubes on synchrotron storage rings, for the purpose of testing resists applied on slabs, individual fields have been irradiated sequentially with different radiation doses in order to determine the influence of the radiation dose on the resist. Moreover, on synchrotron storage rings, a plurality of resist-coated fields have also already been exposed simultaneously, a rapidly rotating diaphragm wheel arranged upstream of the resist layer in the beam path performing the function of a neutral wedge filter. The diaphragm apertures arranged radially on the wheel have different sizes, so that the individual fields are exposed to the radiation for different lengths of time during each revolution. Reproducible radiation conditions on the individual fields of the object are only possible with the diaphragm wheel because the EUV radiation source exhibits virtually steady-state behavior on account of the high repetition frequency and radiates very stably.

Finally, irradiation experiments on resists have already been carried out using low-power laboratory radiation sources for EUV radiation, in each case only an individual field on the object having been irradiated. EUV laboratory radiation sources generate a dense and hot (>200 000° C.) plasma and emit the EUV radiation exclusively in very short pulses (typically 100 ns) with very low repetition rates (typically 10-1000 Hz).

SUMMARY OF THE INVENTION

Taking this prior art as a departure point, the invention is based on the object of providing a device for the test irradiation of objects coated with photosensitive resists which, using an inexpensive radiation source, enables an at least partly simultaneous irradiation of a plurality of irradiation fields on the object with varying dose in the shortest possible time and manages without complex and therefore costly optical systems in the beam path of the EUV radiation and in the case of which a degradation of the optical elements in the beam path through EUV irradiation has no influence on the test result obtained.

In the case of a device of the type mentioned in the introduction, this object is achieved by virtue of the fact that
 the EUV radiation source is a laboratory source for EUV radiation,
 the optical system has at least one filter for suppressing undesirable spectral components of the radiation, in particular of VIS, UV, DUV, VUV radiation, and also at least one mirror for spectrally filtering the "in-band" EUV range,
 the means for interrupting the beam path comprise a plurality of closable diaphragm apertures which enable a temporal control of the irradiation of irradiation fields that lie on the object and are situated downstream of the diaphragm apertures, and
 the at least one monitor detector is arranged downstream of the optical system in the direction of the beam path and detects the radiation dose during irradiation.

The laboratory source for EUV radiation is, by way of example, a low-power plasma-based source, e.g. an EUV lamp having a power of 100 W and a pulse frequency of 50 Hz according to the HCT (hollow cathode triggered) principle. The laboratory source reliably makes the required EUV radiation available over a long operating period.

The plasma of the laboratory source emits highly broadband radiation that also contains DUV, VUV, UV and VIS radiation besides the desired EUV radiation. In order to suppress these undesired spectral components of the radiation, the b optical system preferably has a spectral filter. The filter may comprise for example a thin metal film (e.g. a 150 nm thick zirconium film on a supporting grating). The filter is preferably situated at the exit opening of the laboratory source. By means of this arrangement, the filter prevents contaminants from the laboratory source from passing into the receiving chamber for the object to be irradiated and from soiling parts situated there.

The optical system has the further task of ensuring that the irradiation is effected only with the "in-band" EUV radiation with a wavelength of 13.5 nm. A multilayer mirror, in particular, is suitable for filtering.

The component parts of the optical system have the effect that practically only the desired EUV radiation impinges on the object.

The compact optical system of the device according to the invention, in particular with only a filter and a mirror, enables a very small distance between the EUV laboratory source and the object to be irradiated with homogeneous irradiation of all the irradiation fields. The small distance means that it is possible to utilize a large solid angle of the thermal emission of the plasma even without a complex condenser.

The diaphragm apertures that are closable according to the invention permit an at least partly simultaneous irradiation of the irradiation fields defined on the object through the diaphragm apertures. All the irradiation fields are initially irradiated in parallel until individual diaphragm apertures are closed after reaching the target dose for the assigned irradiation field. A considerable gain in time is thereby achieved when testing the influence of the irradiation dose on a photoresist.

The diaphragm apertures are preferably arranged in a planar plate and have a diameter of 5 mm, by way of example. With 20 diaphragm apertures of this type, the test duration for a photoresist can be reduced almost by a factor of 20 compared with individual irradiations with different radiation doses.

After a calibration that is carried out beforehand, the monitor detectors arranged downstream of the optical system permit an exact measurement of the irradiation dose of the individual irradiation fields. By way of example, a plurality of photodiodes (Schottky type) may be used as monitor detectors. The signals supplied by the diodes are preferably averaged in order to improve the measurement accuracy. By continuously detecting the irradiation dose during irradiation, the irradiation of the irradiation fields can be carried out with precisely definable desired values for the irradiation dose.

The monitor detectors are preferably arranged between the optical system and the closable apertures; they are expediently situated as near as possible to the object to be irradiated. This arrangement of the monitor detectors makes the device insensitive to the degradation of the optical system.

As already mentioned in the introduction, the entire beam path has to be guided up to the object under vacuum conditions. Therefore, the chamber for receiving the object is designed for and evacuated to a negative pressure of $10^{-6}$ m bar for example. It is separated from the discharge chamber of the laboratory source by a window having an opening for the passage of the radiation, a filter of the optical system, for example in the form of a metallic film, being situated, in particular, in the window. This prevents contamination of the receiving chamber. The receiving chamber preferably has a dedicated pump system and, when the object to be irradiated is being handled, is separated by means of a slide valve from the laboratory source and preferably also the region for receiving the optical system.

In order to obtain an irradiation that is as homogeneous as possible in the individual irradiation fields, all the diaphragm apertures are arranged in one plane and the irradiation fields produced on the object through each diaphragm aperture do not overlap. The irradiation fields are preferably arranged parallel to the plane of the diaphragm apertures.

The object coated with photoresist is, in particular, a silicon wafer, for example a 6 inch wafer having a thickness of 650 µm and having 20 irradiation fields defined by the diaphragm apertures. A mount is situated in the receiving chamber and receives the wafer in such a way that the EUV radiation impinges on the photoresist coating thereof.

In an expedient refinement of the invention, the laboratory source emits radiation pulses having a duration of less than 1 µs, in particular 100 ns, with a repetition rate of between 1 and 10000 Hz, in particular 1-5000 Hz. The radiation of the laboratory source originates from a thermally emitting plasma, in particular from a laser-generated or discharge-generated plasma or from an electron beam.

Preferably, a thin metal film, in particular a zirconium film having a thickness of less than 200 nm but more than 100 nm, is arranged in the beam path as filter for suppressing undesirable visible to VUV radiation. The film transmits up to 50% of the desired EUV radiation, while the undesirable radiation is suppressed by a factor of >1000.

Each mirror for spectrally filtering the "in-band" EUV range is preferably configured as a multilayer mirror, in which case the mirror may be embodied as a plane mirror or as a curved mirror. The multilayer mirrors reflect up to 70% of the incident radiation in a narrow spectral band in the EUV range, while radiation that does not lie in this narrow band is almost completely absorbed by the multilayer mirror.

The diaphragm apertures are preferably closed by means of a flat slide which is arranged such that it can be displaced in a plane parallel to the plane of the diaphragm apertures and has a contour enabling successive opening or closing of the diaphragm apertures. The contour is staircase-shaped, in particular, thereby enabling a row-by-row opening or closing of the diaphragm apertures arranged in rows. The flat slide as closure for all the diaphragm apertures, with only one mechanical component, constitutes a solution that is highly expedient in terms of construction and control technology.

BRIEF DESCRIPTION OF THE DRAWINGS

Further advantages and effects of the invention and also the operating procedure thereof emerge from the following description of an exemplary embodiment with reference to the figures.

In the figures.

DETAILED DESCRIPTION OF ILLUSTRATIVE EMBODIMENTS

The device for EUV test irradiation serves for examining a photoresist (resist) for lithography in the range of EUV radiation, i.e. at a wavelength of 13.5 nm, with 20 different radiation doses in one work operation. In this case, the intention is to determine the removal of the photoresist after development and the sharpness of the imaged structures depending on the dose.

Figure 1:
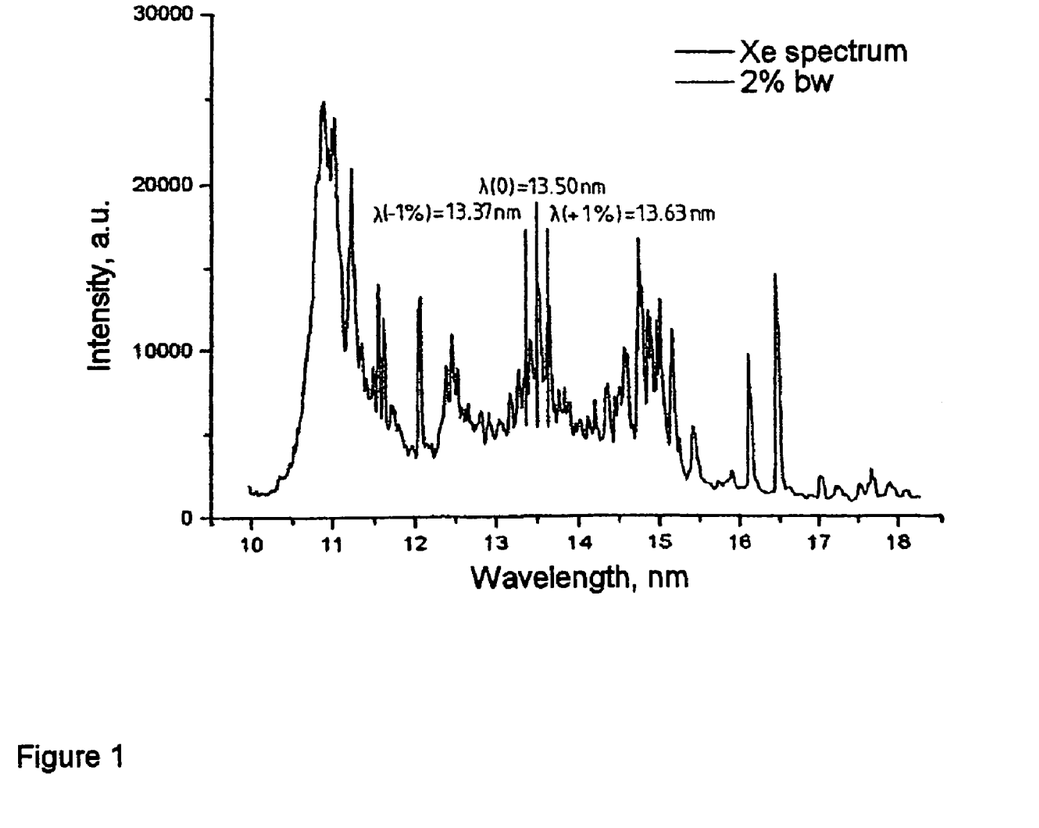
FIG. 1 shows the spectrum of the radiation generated by the EUV radiation source
Figure 2:
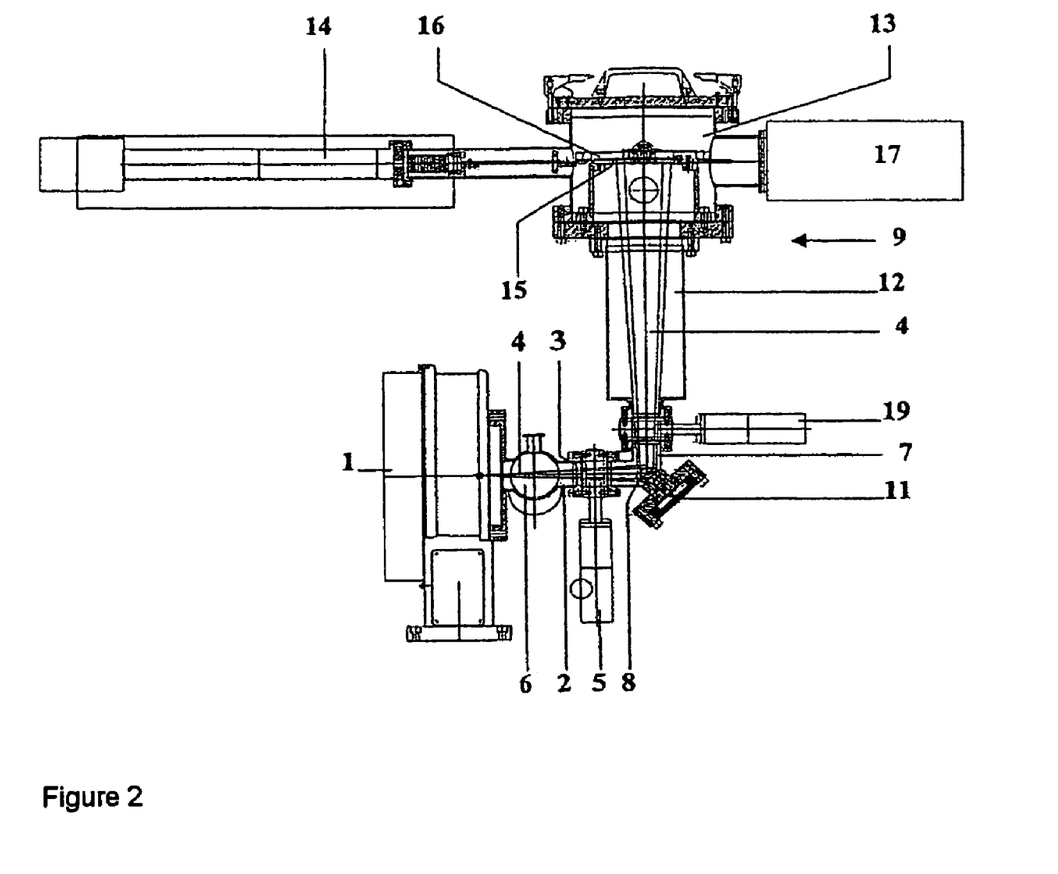
FIG. 2 shows a basic illustration of the device according to the invention for the test irradiation of objects coated with photosensitive resists

The device for EUV test irradiation comprises an EUV laboratory lamp (1), which generates a radiation having a spectrum according to FIG. 1. Via a horizontally oriented beam tube (2) with an exit opening (3), the likewise horizontally oriented beam path (4) leaves the EUV laboratory lamp (1).

A beam tube slide unit (5) is arranged at the exit opening (3). The beam tube slide has a passage into which a 150 nm thick zirconium film is inserted, which can be moved into the beam path (4) by means of the slide. The slide, which is movable transversely with respect to the axis of the beam path (4), permits the zirconium film to be completely moved out of the cross section of the beam tube (2), so that the exit opening (3) is completely closed by the beam tube slide, which incidentally is composed of metal. Furthermore, a turbomolecular pump (6) is arranged at the beam tube (2) and generates a vacuum of approximately $10^{-3}$ mbar in the EUV lamp (1) with a xenon atmosphere being maintained.

The beam tube slide unit (5) is adjoined by a hollow-cylindrical elbow (7), which receives a deflection mirror (8). The deflection mirror (8) is arranged in the interior of the elbow in the outer region of the angled-away portion in such a way that the horizontally impinging beam path (4) is deflected by 90° into a wafer chamber (9), which is designated in its entirety by (9). A mirror receptacle (11) carries and fixes the deflection mirror (8). It is pointed out that the constructionally expedient angle of incidence of the EUV radiation of 45° illustrated in the exemplary embodiment can readily be varied.

The elbow (7) is adjoined by the wafer chamber (9), which comprises a hollow-cylindrical beam tube (12) and also a receiving space (13) for the resist-coated wafer. The beam path (4) propagates proceeding from the deflection mirror (8) through the beam tube (12) in the direction of a diaphragm system (15). The wafer is oriented with its resist surface in the direction of the diaphragm system (15), so that the EUV radiation that passes through the diaphragm system falls onto the resist coating of the wafer. The closure of the diaphragm apertures of the diaphragm system (15) is driven by a stepper motor (14).

A further turbomolecular pump (17) is arranged laterally at the receiving space (13) and, during the exposure, ensures that a pressure of $10^{-6}$ mbar is maintained in the elbow (7) and also the wafer chamber (9).

Figure 3:
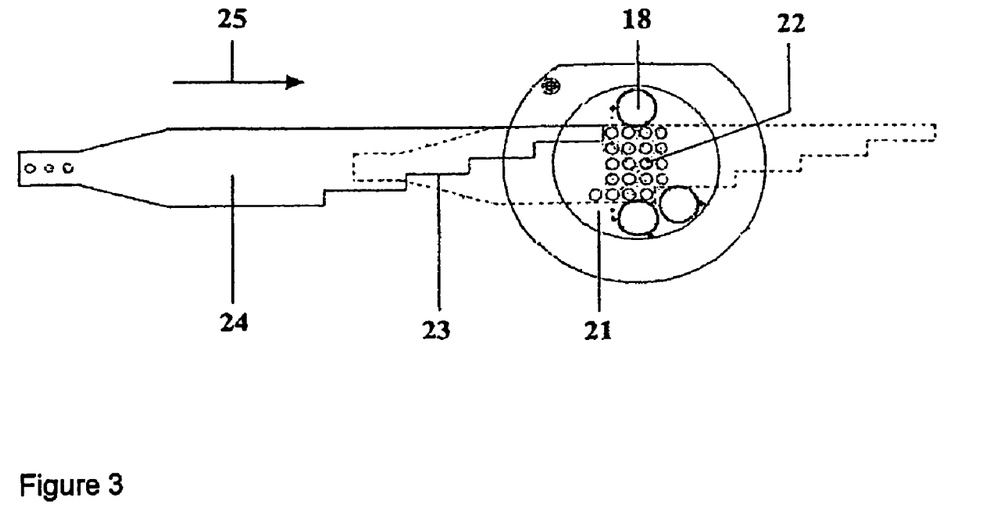
FIG. 3 shows a diaphragm system with a flat slide arranged in the device according to FIG. 2

Three photodiodes (18) are situated in the direction of propagation of the beam path (4) of the EUV radiation laterally in the diaphragm system (15), which photodiodes can be discerned in FIG. 3 and detect the radiation energy of the individual radiation pulses of the EUV lamp (1), the radiation energy being proportional to the charge generated in the photodiodes (18). The photodiodes are arranged at the least possible distance from the diaphragm apertures in the diaphragm system, but in such a way that they are not concealed by the motor-driven closure.

Finally, the device for EUV test irradiation has a further slide (19) arranged between the elbow (7) and the beam tube (12) of the wafer chamber (9). If the slide (19) is closed, the wafer chamber (9) is completely partitioned from the EUV lamp (1) and the interior space of the elbow (7).

FIG. 3 illustrates the construction of the diaphragm system, which is designated in its entirety by (15) and has a perforated mask (21) with 5 rows each having 4 diaphragm apertures (22). The EUV radiation passing through each diaphragm aperture (22) defines a demarcated irradiation field on the resist layer (16) of the wafer. The distance between wafer and diaphragm system (15) and also the distance between the diaphragm apertures (22) are designed such that the irradiation fields do not overlap. As a result, the diaphragm system (15) produces twenty demarcated irradiation fields having a diameter of approximately 5 mm on the surface of the wafer coated with photoresist.

A flat slide (24) having a staircase-shaped contour (23) at the end is situated laterally beside the perforated mask (21). On the opposite side from the contour (23), the flat slide (24) is connected to the stepper motor (14) illustrated in FIG. 2. By moving the flat slide (24) in the direction of the arrow (25), it is possible for the diaphragm apertures (22) to be mechanically closed one after the other row by row. The consequence of this is that the irradiation fields defined by the individual diaphragm apertures (22) acquire individual irradiation times.

During the irradiation of the coated wafer, the slide of the beam tube slide unit (5) is pushed in such that the beam path passes through the zirconium filter. In this case, the filter has two functions:

1. Holding back radiations having wavelengths of greater than 20 nm. At wavelengths of greater than 20 nm, the transmissivity of the zirconium filter is less than 10%.
2. Separating the xenon atmosphere in the EUV lamp (1) from the region which is formed by the elbow (7) and the wafer chamber (9) and into which no xenon gas should pass. The zirconium filter is stable enough to withstand the pressure difference between the EUV lamp (1) and the aforementioned region.

The deflection mirror (8) is a multilayer mirror having, for example, 40 layers of a silicon substrate with a period thickness of approximately 10 nm. This mirror reflects a wavelength of 13.5+/−0.2 nm at an angle of 45° into the beam tube (12) of the wafer chamber (9).

After the conclusion of the irradiation of the photoresist on the wafer, the slide (19) between the elbow (7) and the wafer chamber is closed. As a result, the vacuum is preserved in the EUV lamp (1) and the elbow (7) if the wafer chamber (9) is ventilated in order to open the latter for example for the purpose of removing the irradiated wafer. The slide (19) enables not only shorter evacuation times of the wafer chamber (9) during wafer handling, but furthermore an effective protection of the sensitive optical system that is formed by the zirconium film in the beam tube slide unit (5) and the deflection mirror (8) in the elbow.

The photodiodes (18) arranged in the beam path (4) in the perforated mask (21) measure the radiation energy of the EUV radiation pulses in that they generate a charge proportional to the radiation energy in the photodiodes. The charge generated by the individual pulses is added up electronically and cyclically interrogated by a controller (not illustrated in the figure). If the interrogation reveals that a specific radiation dose (desired value) has been reached, a control command is initiated for the stepper motor (14), which moves the flat slide (24) in the direction of the arrow (25) in order to close the next diaphragm aperture (22) row by row. The desired values that have to be reached depending on a target dose prescribed by the user (definition: a dose which the user of the test system assumes to be optimal for the resist to be examined) before the next diaphragm aperture (22) is closed form the discrete points of an irradiation function. The individual desired values are calculated according to the following formula:

if $s \neq 10$ then:

$$s(F, \text{Exp}, \text{Tar}, \text{Var}) = Tar\left(1 + VB\frac{|RF|}{RF}\left(\frac{|RG|}{10}\right)^{\text{Exp}}\right) \text{ where } VB = \frac{\text{Var}}{100} \text{ and } RF = F - 10$$

otherwise:

$$s(F, \text{Exp}, \text{Tar}, \text{Var}) = Tar$$

The following are applicable in this case:
s The function value s is the desired value that has to be reached before the next diaphragm aperture is closed.
F The parameter F represents the currently closed field and lies in the range of values from 1 to 20.
Exp The parameter Exp is the exponent set by the user and has the values of 1 to 5.
Tar The parameter Tar is the target dose set by the user.
Var The parameter Var is the variation range set by the user in percent in the range from 1 to 100.

Figure 4:
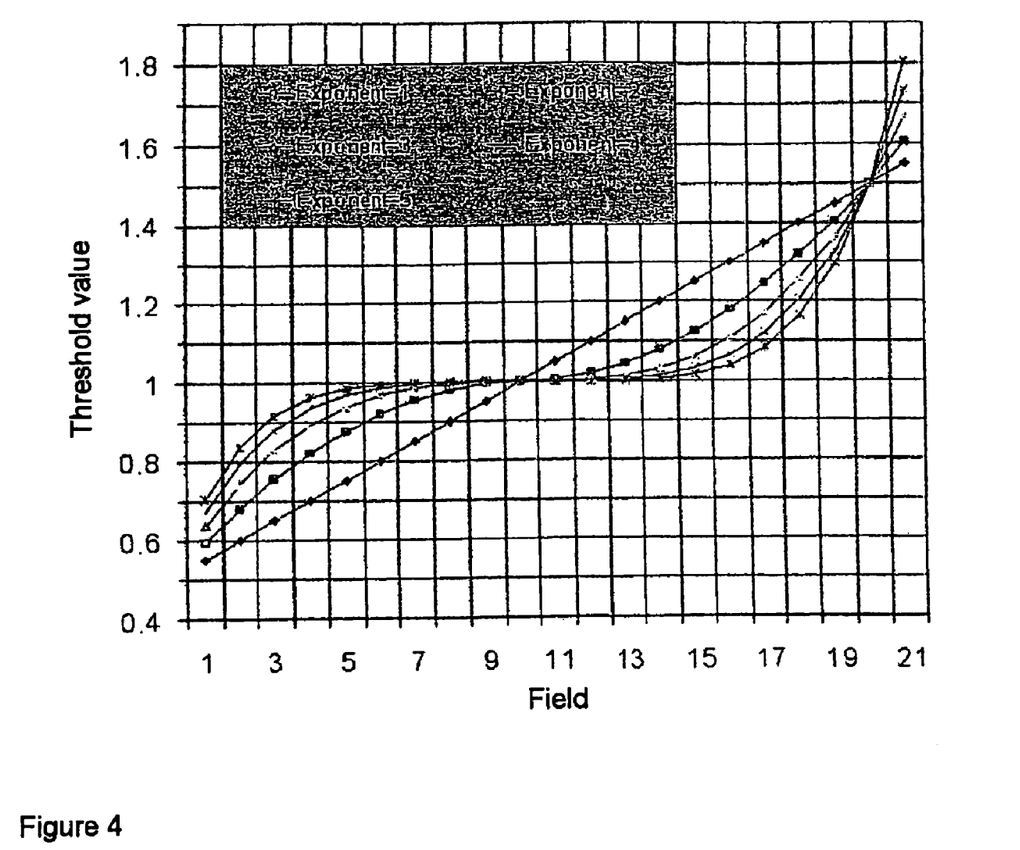
FIG. 4 shows an irradiation function with a variation of 50% with different exponents.

For Tar:=1.0 and Var:=50, the characteristic curves shown in FIG. 4 result depending on the exponent Exp:=1 to 5 for the desired values s. It becomes clear that the density of discrete points around the target dose Tar increases as the exponent Exp increases.

Figure 5:
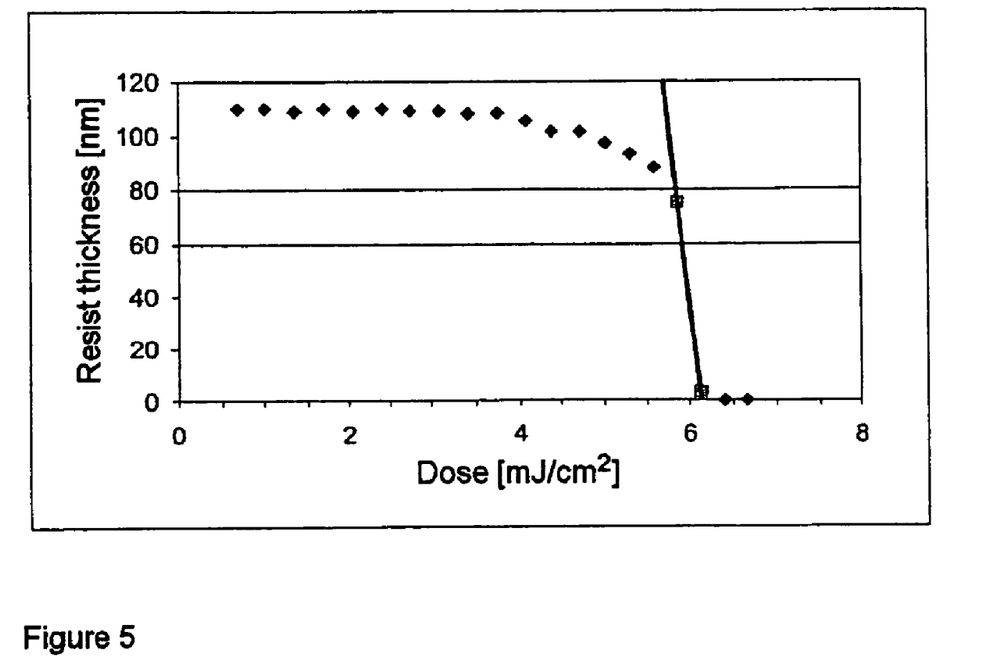
FIG. 5 shows an illustration of the film thickness of a resist application as a function of the dose of a test irradiation.

The irradiation with EUV radiation brings about a removal of the resist film after the development on the wafer. The relationship between dose and removal after the development is illustrated in the curve according to FIG. 5 using the example of a concrete resist. The value for the residual thickness of the resist film falls sharply starting from a specific dose. The minimum dose required for the irradiation of this resist (approximately 6 mJ/cm$^2$ in the exemplary embodiment) can be read from the x axis. In this way, it is possible to determine the EUV radiation sensitivity of a photoresist for wafers in one work operation.

LIST OF REFERENCE SYMBOLS

| | |
|---|---|
| EUV lamp | 1 |
| Beam tube | 2 |
| Exit opening | 3 |
| Beam path | 4 |
| Beam tube slide unit | 5 |
| Turbomolecular pump | 6 |
| Elbow | 7 |
| Deflection mirror | 8 |
| Wafer chamber | 9 |
| — | 10 |
| Mirror receptacle | 11 |
| Beam tube | 12 |
| Receiving space | 13 |
| Stepper motor | 14 |
| Diaphragm system | 15 |
| Wafer with resist layer | 16 |
| Turbomolecular pump | 17 |
| Photodiodes | 18 |
| Slide | 19 |
| — | 20 |
| Perforated mask | 21 |
| Diaphragm apertures | 22 |
| Staircase-shaped contour | 23 |
| Flat slide | 24 |
| Arrow | 25 |

The invention claimed is:

1. A device comprising:
a chamber for receiving an object;
an EUV radiation source for directing a beam through a beam path toward the object, the EUV radiation source comprising a laboratory source for EUV radiation;
an optical system for filtering radiation from the EUV radiation source, the optical system having at least one filter for suppressing undesirable spectral components of the radiation and also at least one mirror for spectrally filtering in-band EUV radiation;
a plurality of closable diaphragm apertures located in the beam path, the plurality of closable diaphragm apertures enabling a temporal control of irradiation of irradiation fields that lie on the object and are situated downstream of the diaphragm apertures; and
at least one monitor detector arranged downstream of the optical system in the direction of the beam path, the monitor detector detecting an irradiation dose during irradiation.

2. The device as claimed in claim 1, wherein the object comprises a wafer coated with photoresist and the chamber for receiving the object has a mount for the wafer.

3. The device as claimed in claim 1, wherein the EUV radiation of the laboratory source originates from a thermally emitting plasma.

4. The device as claimed in claim 1, further comprising a thin metal film arranged in the beam path as a filter for suppressing undesirable visible to VUV radiation.

5. The device as claimed in claim 4, wherein the thin metal film comprises a zirconium film having a thickness of less than 200 nm.

6. The device as claimed in claim 1, wherein the at least one mirror for spectrally filtering the in-band EUV radiation is configured as a multilayer mirror.

7. The device as claimed in claim 1, wherein the at least one monitor detector is situated at a distance from the object to be irradiated, the distance being less than half of a distance between the EUV radiation source and the object to be irradiated.

8. The device as claimed in claim 1, wherein each diaphragm aperture is assigned a separate closure mechanism.

9. The device as claimed in claim 1, wherein each of the diaphragm apertures is arranged in one plane and the irradiation fields that lie on the object through each diaphragm aperture do not overlap.

10. The device as claimed in claim 9, wherein the diaphragm apertures are closable by means of at least one flat slide.

11. The device as claimed in claim 10, wherein the flat slide is arranged such that it can be displaced in a plane parallel to the plane of the diaphragm apertures and has a contour enabling successive opening or closing of the diaphragm apertures.

12. The device as claimed in claim 11, wherein the flat slide has a staircase-shaped contour enabling a row-by-row opening or closing of the diaphragm apertures arranged in rows.

13. A method for irradiating an object, the method comprising:
   directing an EUV radiation beam from a laboratory source;
   filtering the EUV radiation beam to suppress undesirable spectral components of the radiation;
   spectrally filtering the EUV radiation beam in an in-band EUV range;
   detecting a radiation dose during irradiation by the EUV radiation beam; and
   interrupting a beam path of the EUV radiation beam by closing ones of a plurality of closable diaphragm apertures, wherein each diaphragm aperture is closed at an instant when the detecting ascertains that the radiation dose corresponds to a desired value.

14. The method as claimed in claim 13, wherein the plurality of closable diaphragm apertures enable temporal control of the irradiation of irradiation fields that lie on an object being irradiated and are situated downstream of the diaphragm apertures, and wherein each diaphragm aperture is closed at the instant when the detecting ascertains that the irradiation dose in the irradiation field assigned to the diaphragm aperture corresponds to a desired value.

15. The method as claimed in claim 14, wherein the detecting is performed by a plurality of monitor detectors and wherein signals of each monitor detector are added up in a controller and compared with desired values stored there for each diaphragm aperture and, upon reaching the desired value for an irradiation field, the controller drives a drive assigned to the closure of the respective diaphragm aperture.

16. The method as claimed in claim 15, wherein the desired values are generated in automated fashion by the controller.

17. The method as claimed in claim 15, wherein the desired values are generated by the controller on the basis of parameters input by an operator.

18. The method as claimed in claim 15, wherein the desired values are input into the controller by an operator.

19. The method as claimed in claim 18, wherein the number of parameters to be input by the operator is less than or equal to the number of irradiation fields and at least one parameter for characterizing a typical dose for the photoresist to be tested, a parameter for determining the variation range in percent and a parameter for determining the dose profile are input, the variation range defining the range between the highest and lowest value relative to the typical dose and the dose profile defining the change in the dose between two successively closed irradiation fields.

20. A device for the test irradiation of objects coated with photosensitive resists, the device comprising:
   an EUV radiation source;
   an optical system for filtering radiation from the EUV radiation source;
   a chamber for receiving an object, the object being in a beam path of the radiation;
   means for interrupting the beam path onto the object; and
   at least one monitor detector arranged downstream of the optical system in the direction of the beam path;
   wherein:
   the EUV radiation source is a laboratory source for EUV radiation;
   the optical system has at least one filter for suppressing undesirable spectral components of the radiation and also at least one mirror for spectrally filtering radiation in an in-band EUV range;
   the means for interrupting the beam path comprises a plurality of closable diaphragm apertures that enable a temporal control of the irradiation of irradiation fields that lie on the object and are situated downstream of the diaphragm apertures; and
   the at least one monitor detector detects the radiation dose during irradiation.

* * * * *